US012604493B2

(12) United States Patent
Levy et al.

(10) Patent No.: US 12,604,493 B2
(45) Date of Patent: Apr. 14, 2026

(54) DEVICE OVER PATTERNED BURIED POROUS LAYER OF SEMICONDUCTOR MATERIAL

(71) Applicant: GLOBALFOUNDRIES U.S. Inc., Malta, NY (US)

(72) Inventors: Mark D. Levy, Williston, VT (US); Qizhi Liu, Lexington, MA (US); Jeonghyun Hwang, Ithaca, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 857 days.

(21) Appl. No.: 17/852,873

(22) Filed: Jun. 29, 2022

(65) Prior Publication Data

US 2024/0006524 A1 Jan. 4, 2024

(51) Int. Cl.
*H10D 30/47* (2025.01)
*H10D 30/01* (2025.01)
*H10D 62/85* (2025.01)

(52) U.S. Cl.
CPC ......... *H10D 30/475* (2025.01); *H10D 30/015* (2025.01); *H10D 62/8503* (2025.01)

(58) Field of Classification Search
CPC . H10D 30/475; H10D 30/015; H10D 62/8503
USPC ........................................ 257/330
See application file for complete search history.

(56) References Cited

U.S. PATENT DOCUMENTS 5,371,037 A    12/1994  Yonehara
6,150,031 A    11/2000  Yonehara
6,972,215 B2   12/2005  Sakaguchi et al.
9,245,760 B2 *  1/2016  Mauder .............. H01L 21/0262
2003/0087503 A1  5/2003  Sakaguchi et al.
2007/0164358 A1  7/2007  de Souza et al.
2011/0240085 A1 * 10/2011  Sasaki .................. H01G 9/2022
                                                136/244
2013/0196487 A1  8/2013  Sugiyama et al.
2020/0286730 A1  9/2020  Moder et al.

FOREIGN PATENT DOCUMENTS

CN    101563801 A  * 10/2009
CN    102104060 A    6/2011
CN    101273661 B  * 10/2011  .............. H04R 31/00
CN    112736128 A  * 4/2021  .......... H10D 30/015
EP      1417151      5/2004

OTHER PUBLICATIONS

Search Report in related EP Application No. 22202064.6-1211 dated Aug. 31, 2023, 8 pages.

* cited by examiner

*Primary Examiner* — Phuc T Dang
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a patterned buried porous layer of semiconductor material and a device over the patterned buried porous layer, and methods of manufacture. The structure includes: a semiconductor substrate includes a patterned buried porous layer within the semiconductor substrate; a semiconductor compound material over the semiconductor substrate and the patterned buried porous layer; and at least one device on the semiconductor compound material. The non-patterned portions of the semiconductor substrate provide a thermal pathway within the semiconductor substrate.

17 Claims, 4 Drawing Sheets

DEVICE OVER PATTERNED BURIED POROUS LAYER OF SEMICONDUCTOR MATERIAL

BACKGROUND

The present disclosure relates to semiconductor structures and, more particularly, to a patterned buried porous layer of semiconductor material and a device over the patterned buried porous layer, and methods of manufacture.

High-power performance devices which are able to operate at higher frequencies than ordinary transistors, up to millimeter wave frequencies, are used in high-frequency products such as cell phones, satellite television receivers, voltage converters, and radar equipment. The devices are also used in satellite receivers, in low power amplifiers and in the defense industry. A high-electron-mobility transistor (HEMT) is a field-effect transistor which can be used in such applications. The HEMT incorporates a junction between two materials with different band gaps (i.e. a heterojunction) as the channel instead of a doped region.

A commonly used material for the high-power performance devices includes a substrate of GaAs or GaN, though there is wide variation of different materials that can be used as the base substrate, dependent on the application of the device. However, a lattice mismatch between the substrate and a handle wafer can result in a strain placed on the substrate. This strain can lead to cracking and breakage.

SUMMARY

In an aspect of the disclosure, a structure comprises: a semiconductor substrate comprising a patterned buried porous layer within the semiconductor substrate; a semiconductor compound material over the semiconductor substrate and the patterned buried porous layer; and at least one device on the semiconductor compound material. The non-patterned portions of the semiconductor substrate provide a thermal pathway within the semiconductor substrate.

In an aspect of the disclosure, a structure comprises: a buried porous semiconductor material having openings; a semiconductor substrate within the openings and at least below the buried porous semiconductor material; a semiconductor compound material which has a lattice mismatch with the semiconductor substrate, the semiconductor compound material over the semiconductor substrate and the buried porous layer; and at least one active device on the semiconductor compound material.

In an aspect of the disclosure, a method comprises: forming a patterned buried porous layer within a semiconductor substrate; forming a semiconductor compound material over the semiconductor substrate and the patterned buried porous layer; and forming at least one device on the semiconductor compound material. the patterned buried porous layer is formed with openings that provide a thermal pathway within the semiconductor substrate.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a patterned buried porous layer of semiconductor material and a device over the patterned buried porous layer, and methods of manufacture. More specifically, the present disclosure relates to a buried patterned porous Si layer under an active or passive device. In embodiments, the active or passive device may be provided on a III-V semiconductor substrate. Advantageously, the present disclosure provides a reduction in stress of the III-V semiconductor substrate due to a lattice mismatch with an underlying substrate material. In addition, the present disclosure provides improved heat dissipation and net improvement of device performance.

Figure 1:
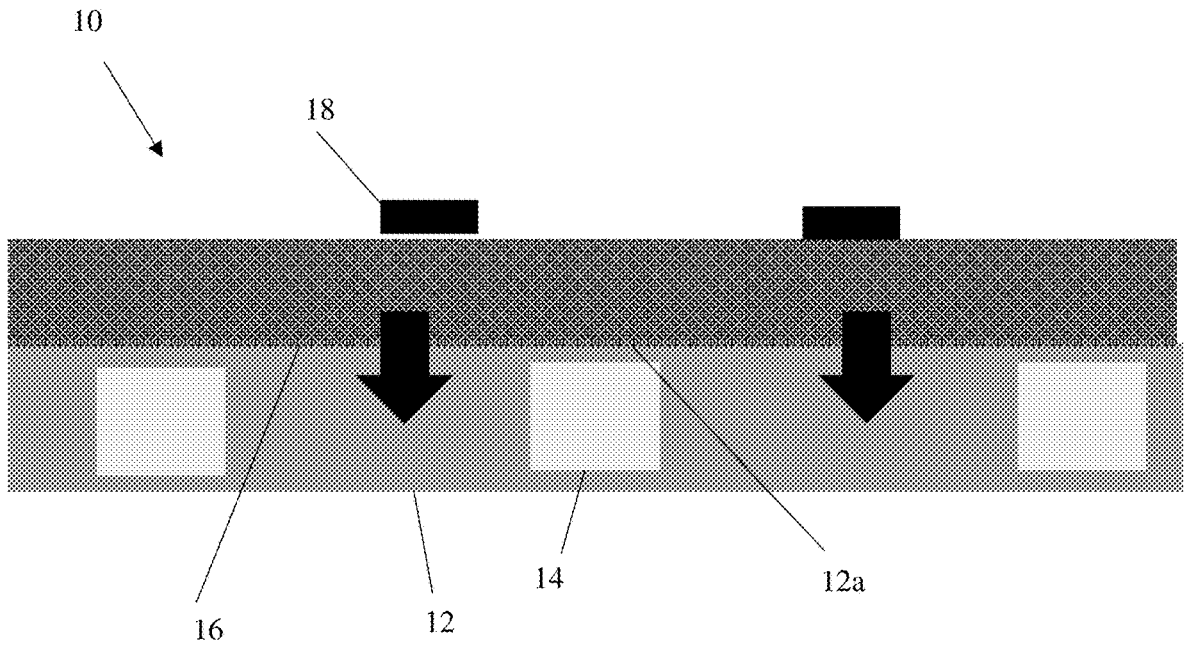
FIG. 1 shows a structure with a patterned buried porous layer and respective fabrication processes in accordance with aspects of the present disclosure.

FIG. 1 shows a structure with a patterned buried porous layer and respective fabrication processes in accordance with aspects of the present disclosure. The structure 10 of FIG. 1 comprises a semiconductor substate 12 with a patterned buried porous layer 14. In embodiments, the semiconductor substrate 12 may be a handle substrate and the patterned buried porous layer 14 surrounds portions of the semiconductor substate 12. The patterned porous layer 14 may be manufactured according to different processing steps as disclosed in FIG. 5A.

In embodiments, the semiconductor substate 12 may be a handle substrate with a hexagonal geometry. In more specific embodiments, the semiconductor substate 12 may be a semiconductor material comprising a monocrystalline structure with a <111> orientation. In even more specific embodiments, the semiconductor substate 12 may be Si material with a <111> orientation. It should be understood by those of skill in the art, though, that other semiconductor materials that are compatible with III-V compound semiconductor substrates are also contemplated herein.

Still referring to FIG. 1, a semiconductor material 12a may be formed over the semiconductor substate 12 and the patterned buried porous layer 14. In embodiments, the semiconductor material 12a may be epitaxial grown semiconductor material. The epitaxial semiconductor material 12a may be the same semiconductor material as the semiconductor substate 12.

A III-V semiconductor compound substrate 16 may be provided on the epitaxial semiconductor material 12a. In embodiments, the III-V semiconductor compound substrate 16 is preferably GaN or AlGaN. In embodiments, the patterned buried porous layer 14 may be used to reduce a stress on the III-V compound semiconductor substrate 16, which occurs due to a lattice mismatch between the III-V semiconductor compound substrate 16 and the semiconductor substate 12. In this way, the use of the patterned buried porous layer 14 will prevent cracking and chip failure.

FIG. 1 further shows one or more devices 18 formed on the III-V semiconductor compound substrate 16. In embodiments, the devices 18 may be active or passive devices. In more specific embodiments, the devices 18 may be any device that generates heat. In even more specific embodiments, the devices 18 may be transistors and, in particular, a high-electron-mobility transistor (HEMT). As is understood, the HEMT is a field-effect transistor incorporating a junction between two materials with different band gaps (i.e. a heterojunction) as the channel instead of a doped region. HEMT transistors are able to operate at higher frequencies than ordinary transistors, up to millimeter wave frequencies, and are used in high-frequency products such as cell phones, satellite television receivers, voltage converters, and radar equipment.

As shown in FIG. 1, the devices 18 may be located above the monocrystalline region of the semiconductor substrate (e.g., handle substrate 12) and surrounded by (e.g., around its perimeter) porous Si material, e.g., patterned buried porous layer 14. In this way, a thermal pathway may be provided (as depicted by the arrows) through the semiconductor substate 12 and below the patterned buried porous layer 14. The thermal pathway will allow heat to dissipate to a back side of the semiconductor substate 12, e.g., below the patterned buried porous layer 14. Accordingly, it should be understood by those of skill in the art that the patterned buried porous layer 14 is not a blanket deposition of material or a single, monolithic structure throughout the semiconductor substrate 12, as such would block the thermal pathway of the heat generated by the devices 18 due to the poor thermal dissipative properties of the patterned buried porous layer 14 which, in turn, would lower device performance. Instead, the patterned buried porous layer 14 includes discrete openings in which the semiconductor substrate 12 provides one or more thermal pathways within the semiconductor substrate 12 thereby achieving greater thermal dissipation compared to known structures.

Figure 2:
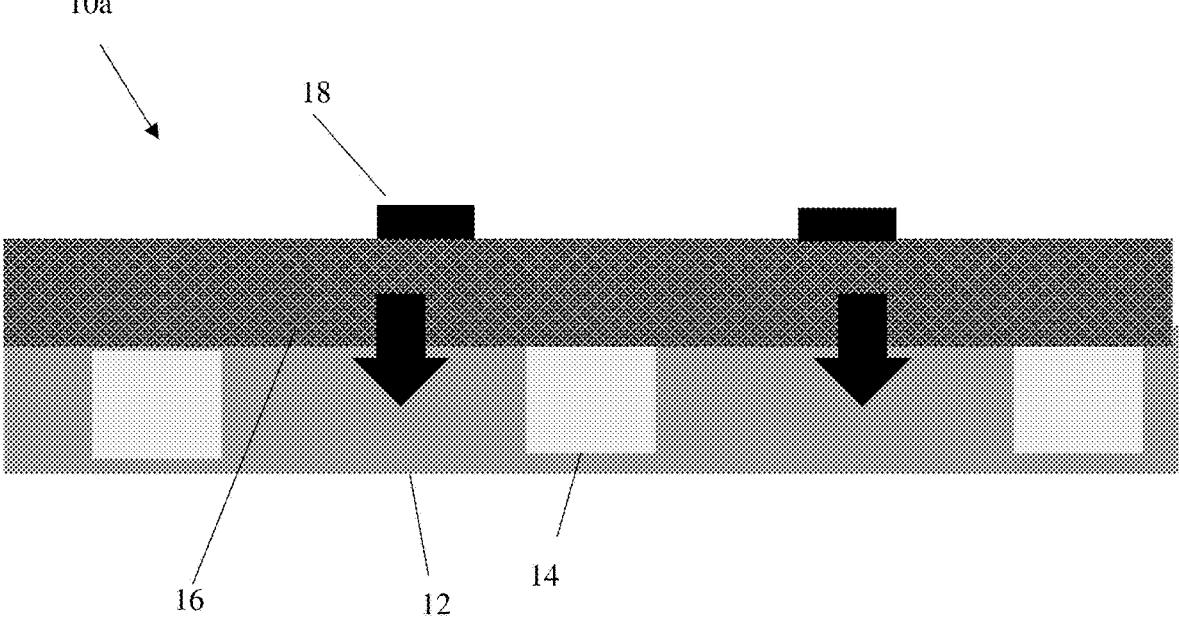
FIG. 2 shows a structure with a patterned buried porous layer in accordance with additional aspects of the present disclosure.

FIG. 2 shows a structure 10a with a patterned buried porous layer 14 in accordance with additional aspects of the present disclosure. In the structure 10a of FIG. 2, the III-V semiconductor compound substrate 16 may be provided directly on (e.g., directly contacting) the semiconductor substate 12 and the patterned buried porous layer 14. Accordingly, in this embodiment, there is no intervening material between the semiconductor substrate 12 and the III-V semiconductor compound substrate 16 thus eliminating the need for the epitaxial semiconductor material 12a of FIG. 1. The patterned buried porous layer 14, alone, will prevent stress from being placed on the III-V semiconductor compound substrate 16, eliminating cracking. The remaining features are similar to the structure 10 of FIG. 1.

Figure 3:
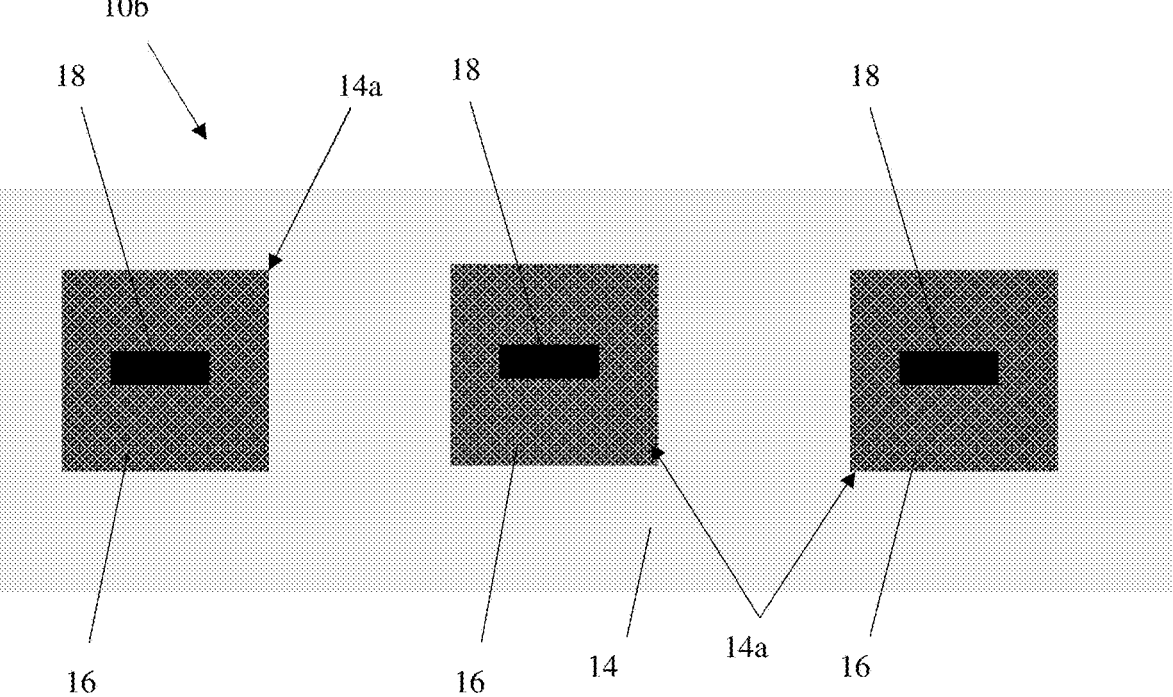
FIG. 3 shows a top view of a structure with a patterned buried porous layer in accordance with additional aspects of the present disclosure.

FIG. 3 shows a top view of a structure with the buried porous layer in accordance with additional aspects of the present disclosure. In the structure 10b of FIG. 3, each of the devices 18 are shown to be located over and aligned with the openings 14a of the patterned buried porous layer 14 (on the III-V semiconductor compound substrate 16). That is, in this embodiment, the patterned buried porous layer 14 is not directly underneath the devices, but is patterned to have openings 14a which are aligned with the devices 18. In this way, the patterned buried porous layer 14 surrounds the devices 18 around its perimeter, with the openings 14a providing a thermal pathway for heat generated from the devices 18 to dissipate within the semiconductor substrate 12.

Figure 4:
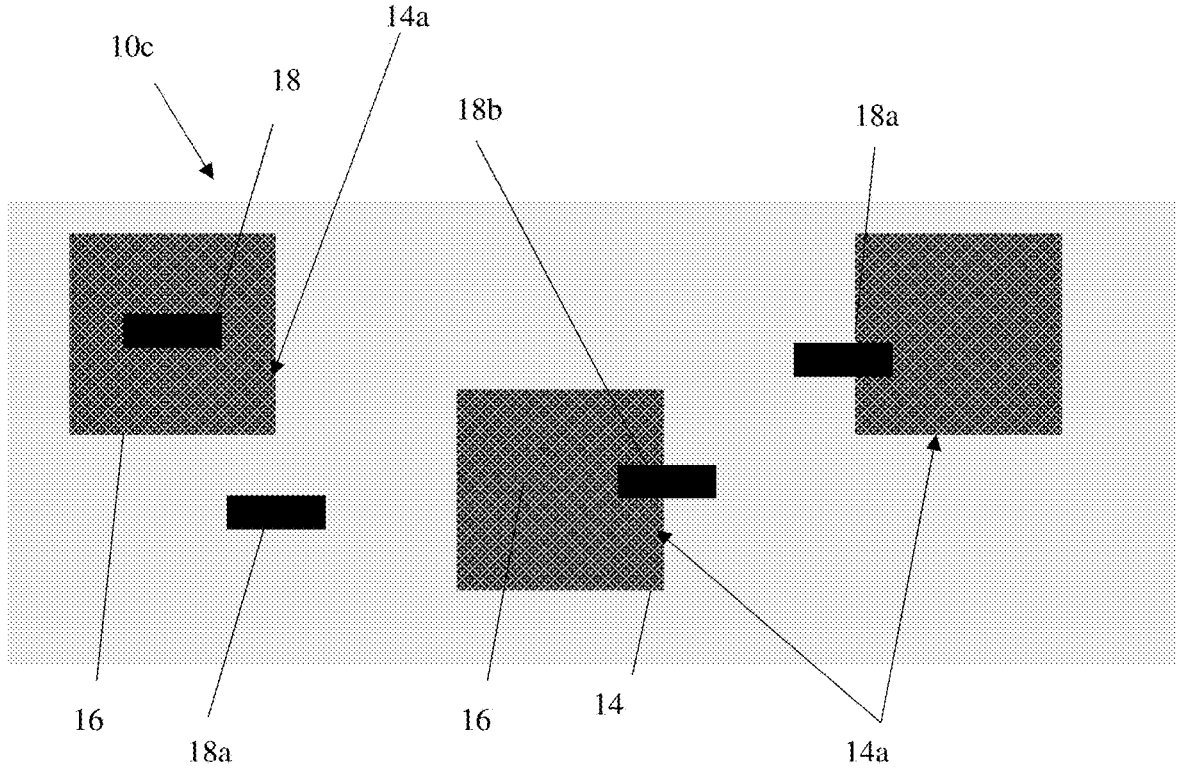
FIG. 4 shows a top view of a structure with a patterned buried porous layer in accordance with additional aspects of the present disclosure.

FIG. 4 shows a structure with a buried porous layer in accordance with additional aspects of the present disclosure. In the structure 10c of FIG. 4, some devices 18 may be located over and aligned with the openings 14a of the patterned buried porous layer 14, whereas other devices 18a may partially extend over the openings 14a of the patterned buried porous layer 14 and other devices 18b may be entirely over portions of the patterned buried porous layer 14, e.g., offset from the openings 14a. That is, the patterned buried porous layer 14 may be fully underneath the devices 18b and/or partially underneath the devices 18a. It should be understood, though, as the buried porous layer 14 remains patterned with openings 14a, a thermal pathway still exists for heat to freely flow away from the devices 18, 18a, 18b through the underlying semiconductor substrate 12.

Figure 5A:
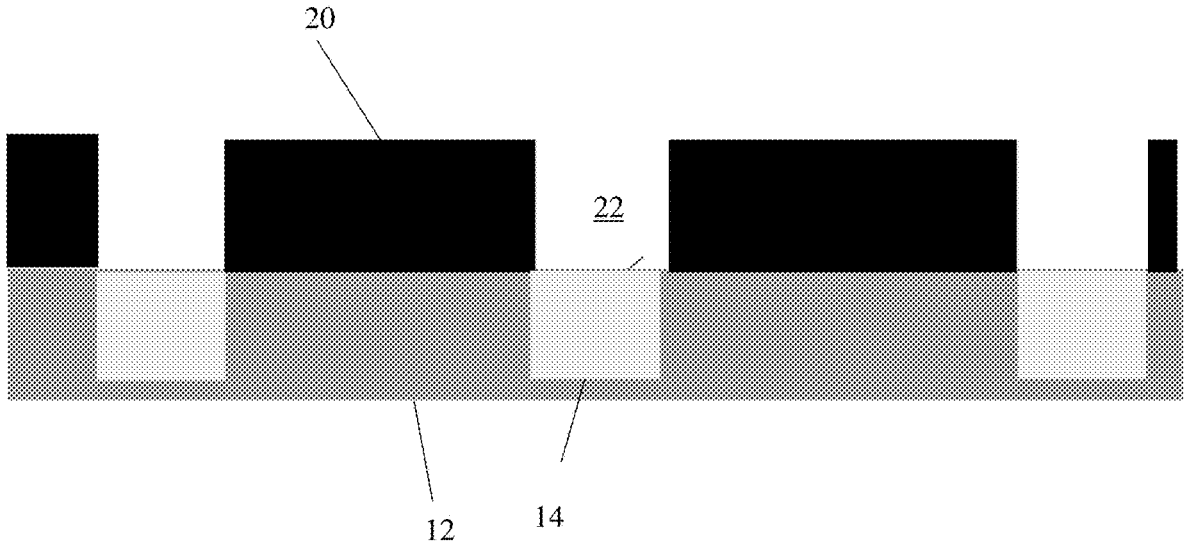
FIGS. 5A and 5B show processing steps for fabricating the structure of FIG. 1 in accordance with aspects of the present disclosure.
Figure 5B:
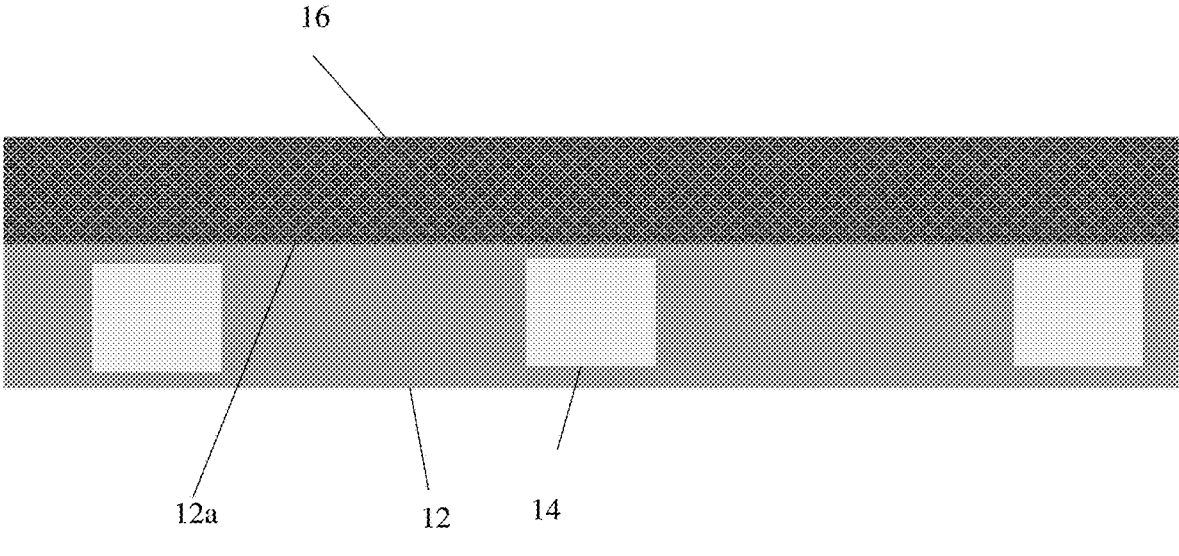

FIGS. 5A and 5B show processing steps for fabricating the structure of FIG. 1 in accordance with aspects of the present disclosure. For example, in FIG. 5A, a hardmask (e.g., resist) 20 may be formed over the semiconductor substrate 12 and patterned to form openings 22. The patterning process may be any conventional lithography and etching processes as is known in the art such that no further explanation is required for a complete understanding of the present disclosure. The semiconductor substrate 12 may then be subjected to an oxygen implant process through the openings 22 to form the patterned buried porous layer 14 from and within the semiconductor substrate 12.

In an alternative embodiment, the patterned buried porous layer 14 may be formed by a wet etching process using an HF solution on the semiconductor substrate 12 through the openings 22 to form pores within the semiconductor substrate 12 and, hence, form the patterned buried porous layer 14. In another alternative embodiment, the patterned buried porous layer 14 may be formed by a charged ion implant in the semiconductor substrate 12 through the openings 22 to form the patterned buried porous layer 14. In any of these embodiments, the placement of the mask will create the openings 14a by blocking the implant/etchant, etc.

In FIG. 5B, the resist is removed by conventional stripants and an epitaxial semiconductor material 12a may be formed over the patterned buried porous layer 14 and the semiconductor substrate 12. In embodiments, the epitaxial semiconductor material 12a may be formed by a conventional epitaxial growth process as is known in the art. For the embodiment shown in FIG. 2, this growth step may be eliminated. A III-V semiconductor compound substrate 16 may be epitaxially grown over the semiconductor substrate 12 including the patterned buried porous layer 14.

Referring back to FIG. 1, the HEMT or other devices 18 may be manufactured in a number of ways using a number of different tools. In general, though, the methodologies and tools are used to form structures with dimensions in the micrometer and nanometer scale. The methodologies, i.e., technologies, employed to manufacture the device 18 of the present disclosure have been adopted from integrated circuit (IC) technology. For example, the structures are built on wafers, e.g., the III-V semiconductor compound substrate 16, and are realized in films of material patterned by photolithographic processes. In particular, the fabrication of the device uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art for source and drain regions. The source and drain regions may also be formed by known epitaxial growth processes with an in-situ doping.

The structures described herein can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a semiconductor substrate comprising a patterned buried porous layer within the semiconductor substrate;
a semiconductor compound material over the semiconductor substrate and the patterned buried porous layer; and
at least one device on the semiconductor compound material,
wherein non-patterned portions of the semiconductor substrate provide a thermal pathway within the semiconductor substrate,
wherein the at least one device comprises one or more devices partially extending over openings within the patterned buried porous layer.

2. The structure of claim 1, wherein the patterned buried porous layer comprises a same semiconductor material as the semiconductor compound material.

3. The structure of claim 1, wherein the semiconductor substrate comprises a monocrystalline structure with a <111> orientation.

4. The structure of claim 1, wherein the semiconductor substrate comprises Si with a <111> orientation.

5. The structure of claim 1, wherein the semiconductor compound material comprises a III-V semiconductor compound material.

6. The structure of claim 5, wherein the III-V semiconductor compound material comprises GaN.

7. The structure of claim 6, wherein the at least one device comprises a high-electron-mobility transistor (HEMT).

8. The structure of claim 5, wherein the III-V semiconductor compound material is directly contacting and over the patterned buried porous layer.

9. The structure of claim 1, wherein the at least one device comprises one or more devices aligned with openings within the patterned buried porous layer, the openings providing the thermal pathway.

10. The structure of claim 1, wherein the semiconductor substrate comprises Si with a <111> orientation and the III-V semiconductor compound material comprises GaN.

11. The structure of claim 1, wherein the openings comprise one or more thermal conductive pathways with the semiconductor substrate.

12. The structure of claim 1, wherein the at least one active device comprises one or more active devices aligned with openings.

13. The structure of claim 1, wherein the at least one active device comprises one or more active devices partially extending over the openings.

14. The structure of claim 1, wherein the semiconductor compound material directly contacts the buried porous layer with no intervening layers of material therebetween.

15. The structure of claim 1, further comprising an epitaxial semiconductor material between the buried porous layer and the semiconductor compound material.

16. A structure comprising:
a semiconductor substrate comprising a patterned buried porous layer within the semiconductor substrate;
a semiconductor compound material over the semiconductor substrate and the patterned buried porous layer; and
at least one device on the semiconductor compound material,
wherein non-patterned portions of the semiconductor substrate provide a thermal pathway within the semiconductor substrate and the at least one device comprises one or more devices offset from openings within the patterned buried porous layer.

17. A method comprising:
forming a patterned buried porous layer within a semiconductor substrate;
forming a semiconductor compound material over the semiconductor substrate and the patterned buried porous layer; and
forming at least one device on the semiconductor compound material,
wherein the non-patterned buried porous layer provides a thermal pathway within the semiconductor substrate and the at least one device comprises one or more devices partially extending over openings within the patterned buried porous layer.

* * * * *